(12) United States Patent
Mitsuishi et al.

(10) Patent No.: US 8,558,251 B2
(45) Date of Patent: Oct. 15, 2013

(54) LIGHT EMITTING DEVICE

(75) Inventors: Iwao Mitsuishi, Tokyo (JP); Yumi Fukuda, Tokyo (JP); Aoi Okada, Tokyo (JP); Ryosuke Hiramatsu, Kanagawa (JP); Naotoshi Matsuda, Kanagawa (JP); Shinya Nunoue, Chiba (JP); Keiko Albessard, Kanagawa (JP); Masahiro Kato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 13/214,444

(22) Filed: Aug. 22, 2011

(65) Prior Publication Data

US 2012/0056209 A1 Mar. 8, 2012

(30) Foreign Application Priority Data

Sep. 6, 2010 (JP) ................................. 2010-198630
Aug. 16, 2011 (JP) ................................. 2011-177806

(51) Int. Cl.
*H01L 29/88* (2006.01)
*F21V 9/00* (2006.01)

(52) U.S. Cl.
USPC ............................................ 257/88; 362/231

(58) Field of Classification Search
None
See application file for complete search history.

(56) References Cited

U.S. PATENT DOCUMENTS

| | | | | |
|---|---|---|---|---|
| 7,964,885 B2 * | 6/2011 | Yoo et al. | .......................... | 257/98 |
| 2004/0104391 A1 * | 6/2004 | Maeda et al. | ................... | 257/79 |
| 2009/0096361 A1 * | 4/2009 | Fukuda et al. | ................. | 313/504 |
| 2009/0236963 A1 | 9/2009 | Nagatomi et al. | | |
| 2010/0025632 A1 | 2/2010 | Fukuda et al. | | |
| 2010/0102707 A1 | 4/2010 | Fukuda et al. | | |
| 2011/0085352 A1 | 4/2011 | Ito et al. | | |
| 2011/0177635 A1 | 7/2011 | Mitsuishi et al. | | |
| 2011/0204769 A1 | 8/2011 | Fukuda et al. | | |
| 2011/0220919 A1 | 9/2011 | Okada et al. | | |

FOREIGN PATENT DOCUMENTS

| | | |
|---|---|---|
| JP | 2007-122950 | 5/2007 |
| JP | 2007-220830 | 8/2007 |
| JP | 2008-258356 | 10/2008 |
| JP | 2010-31201 | 2/2010 |

(Continued)

OTHER PUBLICATIONS

Naoto Hirosali, Characterization and properties of green-emitting Beta SiAlON:Eu2+ powder phosphors for white light-emitting diodes; Applied Physics Letters, vol. 86, 211905 (2005).*

(Continued)

*Primary Examiner* — W. Wendy Kuo
*Assistant Examiner* — Moazzam Hossain
(74) *Attorney, Agent, or Firm* — Oblon, Spivak, McClelland, Maier & Neustadt, L.L.P.

(57) ABSTRACT

A light emitting device according to one embodiment includes a board; plural first light emitting elements mounted on the board to emit light having a wavelength of 250 nm to 500 nm; plural second light emitting elements mounted on the board to emit light having a wavelength of 250 nm to 500 nm; a first fluorescent layer formed on each of the first light emitting elements, the first fluorescent layer including a first phosphor; and a second fluorescent layer formed on each of the second light emitting elements, the second fluorescent layer including a second phosphor. The second phosphor is higher than the first phosphor in luminous efficiency at 50° C., and is lower than the first phosphor in the luminous efficiency at 150° C.

19 Claims, 7 Drawing Sheets

(56) References Cited

FOREIGN PATENT DOCUMENTS

| JP | 2010-106127 | 5/2010 |
|---|---|---|
| WO | WO 2006/093298 A1 | 9/2006 |
| WO | WO 2009/145298 A1 | 12/2009 |

OTHER PUBLICATIONS

Office Action issued on Nov. 22, 2011 in the corresponding Japanese Patent Application No. 2011-177806 (with English Translation).

U.S. Appl. No. 13/033,917, filed Feb. 24, 2011, Mitsuishi, et al.
U.S. Appl. No. 13/037,635, filed Mar. 1, 2011, Okada.
U.S. Appl. No. 13/033,954, filed Feb. 24, 2011, Mitsuishi.
U.S. Appl. No. 13/033,960, filed Feb. 24, 2011, Mitsuishi.
U.S. Appl. No. 13/034,120, filed Feb. 24, 2011, Mitsuishi.
U.S. Appl. No. 13/039,082, filed Mar. 2, 2011, Kato.
U.S. Appl. No. 13/034,137, filed Feb. 24, 2011, Mitsuishi.
U.S. Appl. No. 13/216,860, filed Aug. 24, 2011, Fukuda.
U.S. Appl. No. 13/214,444, filed Aug. 22, 2011, Mitsuishi.

\* cited by examiner

LIGHT EMITTING DEVICE

CROSS-REFERENCE TO RELATED APPLICATION

This application is based upon and claims the benefit of priority from Japanese Patent Application No. 2010-198630, filed on Sep. 6, 2010, and No. 2011-177806, filed on Aug. 16, 2011; the entire contents of which are incorporated herein by reference.

FIELD

Embodiments described herein relate generally to a light emitting device.

BACKGROUND

Recently, attention focuses on a so-called white-color Light Emitting Device (LED) in which a yellow phosphor such as YAG:Ce is combined with a blue LED to emit white-color light by single chip. Conventionally, the LED emits red, green, or blue light in monochromatic form, and it is necessary that the plural LEDs emitting monochrome wavelengths are driven in order to emit the white-color light or intermediate-color light. However, currently the combination of the light emitting diode and the phosphor removes the trouble to obtain the white-color light with a simple structure.

An LED lamp in which the light emitting diode is used is applied to various display devices of a mobile device, a PC peripheral device, an OA device, various switches, a light source for backlight, and a display board. In the LED lamps, there is a strong demand for high efficiency. Additionally, there is a demand for high color rendering performance in general-purpose lighting applications, and there is a demand for high color gamut in LCD TV applications. High efficiency of the phosphor is required for the purpose of the high efficiency of the LED lamp, and a white-color light source in which a phosphor emitting blue excitation light, a phosphor excited by blue light to emit to green light, and a phosphor excited by blue light to emit red light are combined is preferable to the high color rendering or the high color gamut.

The high-power LED generates heat by drive, and generally the phosphor is heated up to about 100 to about 200° C. When the temperature is increased, generally emission intensity of the phosphor is degraded to generate so-called thermal quenching. Therefore, unfortunately the emission intensity is degraded particularly in a high-temperature region, that is, a high-current (high-power) range.

DETAILED DESCRIPTION

A light emitting device according to one embodiment includes a board; plural first light emitting elements mounted on the board to emit light having a wavelength of 250 nm to 500 nm; plural second light emitting elements mounted on the board to emit light having a wavelength of 250 nm to 500 nm; a first fluorescent layer formed on each of the first light emitting elements, the first fluorescent layer including a first phosphor; and a second fluorescent layer formed on each of the second light emitting elements, the second fluorescent layer including a second phosphor. The second phosphor is higher than the first phosphor in luminous efficiency at 50° C., and is lower than the first phosphor in the luminous efficiency at 150° C.

Embodiments will be described below with reference to the drawings.

As used herein, a "rate of increase in temperature" means a ratio of the increase in temperature to an input current (or an input power) of the light emitting device. It can be computed, for example, by measuring a change in temperature to the input power at a predetermined position of the light emitting device with a measurement device such as a thermocouple and a radiation thermometer.

As used herein, the "luminous efficiency of phosphor" means a ratio of light energy of fluorescence emitted by the phosphor to light energy of excitation light. The "luminous efficiency of light emitting device" means a total luminous flux emitted from the light emitting device with respect to an input power of the light emitting device.

As used herein, the "white-color light" means a concept including a light bulb color, a warm white color, a white color, a day white light, and a day light color, those used generally in the lighting device.

As used herein, the "fluorescent layer" means a concept including both a single layer and plural layers.

(First Embodiment)

A light emitting device according to a first embodiment includes a board; plural first light emitting elements that are mounted on the board to emit light having a wavelength of 250 nm to 500 nm; and plural second light emitting elements that are mounted on the board to emit light having a wavelength of 250 nm to 500 nm. The light emitting device of the first embodiment also includes a first fluorescent layer that is formed on the first light emitting element, the first fluorescent layer including a first phosphor; and a second fluorescent layer that is formed on the second light emitting element, the second fluorescent layer including a second phosphor being higher than the first phosphor in luminous efficiency at 50° C., being lower than the first phosphor in the luminous efficiency at 150° C.

The light emitting device of the first embodiment includes the fluorescent layer that includes the phosphor having the high luminous efficiency at low temperature and the fluorescent layer that includes phosphor having the high luminous efficiency at high temperature on different light emitting elements. Therefore, the excellent luminous efficiency is simply and easily realized in the whole temperature range, that is, the whole range from a low current to a high current input to the light emitting device.

Figure 1:
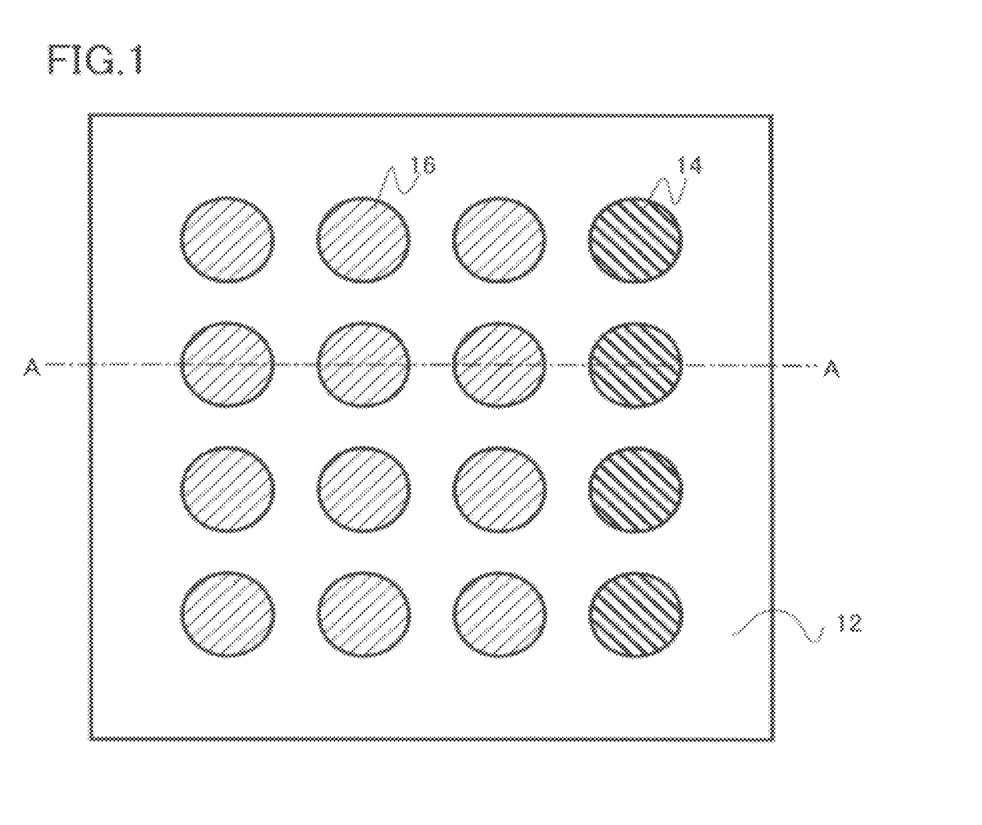
FIG. 1 is a schematic plan view illustrating a light emitting device according to a first embodiment.
Figure 2:
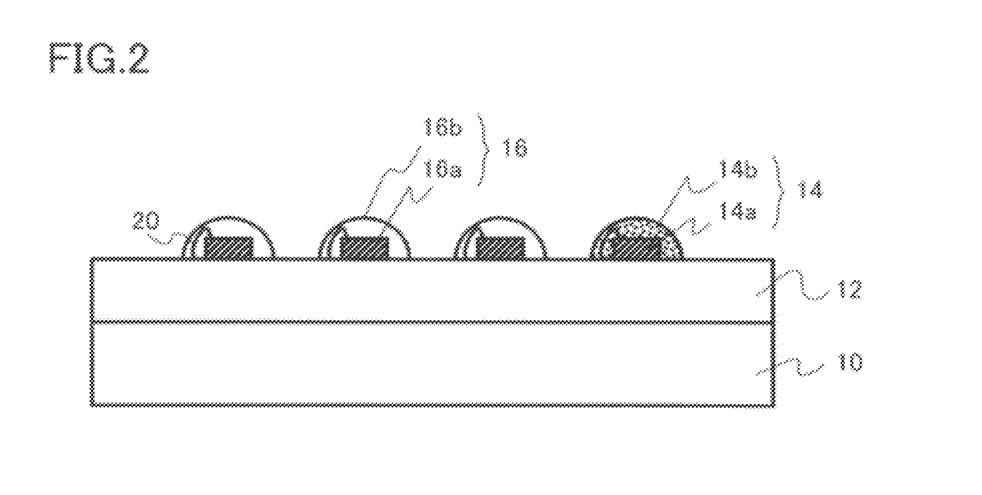
FIG. 2 is a schematic sectional view taken on a line A-A of FIG. 1.

FIG. 1 is a schematic perspective view illustrating the light emitting device of the first embodiment. FIG. 2 is a schematic sectional view taken on a line A-A of FIG. 1.

In the light emitting device of the first embodiment, aboard 12 is formed on a heat sink 10. Plural first white-color LEDs 14 and plural second LEDs 16 are disposed on the board 10.

The first white-color LED 14 includes a first light emitting element 14a that is mounted on the board and a first fluorescent layer 14b that is formed on the first light emitting element 14a. The second white-color LED 16 includes a second light emitting element 16a that is mounted on the board and a second fluorescent layer 16b that is formed on the second light emitting element 16a.

The first light emitting element 14a is a light source that excites the first phosphor included in the first fluorescent layer 14b, and the second light emitting element 16a is a light source that excites the second phosphor included in the second fluorescent layer 16b. The first light emitting element 14a and the second light emitting element 16a emit the light ranging from near-ultraviolet to blue, that is, the light having the wavelength of 250 nm to 500 nm. For example, the first light emitting element 14a and the second light emitting element 16a are blue LED chips. The first light emitting element 14a and the second light emitting element 16a may be the same kinds of the light emitting elements or the different kinds of light emitting elements.

For example, each of the light emitting element 14a and 16a is connected to wiring (not illustrated) through a gold wire 20. Driving currents are supplied to the light emitting elements 14a and 16a from the outside through the wiring, whereby the light emitting elements 14a and 16a emit the blue light for excitation.

The first phosphor is included in the first fluorescent layer 14b, and the second phosphor is included in the second fluorescent layer 16b. The second phosphor has characteristics in which the second phosphor is higher than the first phosphor in the luminous efficiency at 50° C. while the second phosphor is lower than the first phosphor in the luminous efficiency at 150° C.

In the first embodiment, a so-called sialon phosphor is used as the first phosphor having the above-described characteristics. A so-called silicate phosphor is used as the second phosphor.

The sialon green phosphor of the first embodiment has a composition expressed by the following equation (1), and the red phosphor has a composition expressed by the following equation (2). In the sialon phosphor, the decrease in luminous efficiency is relatively small at high temperature. That is, the sialon phosphor has a characteristic of the small temperature quenching.

(1)

(In the equation (1), M is an element that is selected from IA group elements, IIA group elements, IIIA group elements, IIIB group elements except Al (Aluminum), rare-earth elements, and IVB group elements. x1, y1, z1, u, and w satisfy the following relationship.

$0<x1<1$, $-0.1<y1<0.3$, $-3<z1<1$, $-3<u-w≤1.5$)

The sialon phosphor having the composition expressed by the equation (1) is a green phosphor (G). When the green phosphor (G) is excited with the light having the wavelength of 250 nm to 500 nm, that is, the near-ultraviolet light or the blue light, the green phosphor (G) emits the light in the range of a blue-green color to a yellow-green color, which are longer than the excitation light, that is, the light having a peak in the wavelength of 490 nm to 580 nm.

Desirably, the element M is Sr (Strontium). The element M may include other elements such as Ca (Calcium) less than or equal to around 10 mol % in addition to Sr.

(2)

(In the equation (2), M' is an element that is selected from IA group elements, IIA group elements, IIIA group elements, IIIB group elements except Al (Aluminum), rare-earth elements, and IVB group elements. x2, a1, b1, c1, and d1 satisfy the following relationship.

$0<x2<1$, $0.55<a1<0.95$, $2.0<b1<3.9$,

$0<c1<0.6$, $4<d1<5.7$)

The sialon phosphor having the composition expressed by the equation (2) is a red phosphor (R). When the red phosphor (R) is excited with the light having the wavelength of 250 nm to 500 nm, that is, the near-ultraviolet light or the blue light, the red phosphor (R) emits the light in the range of a orange color to a red color, which are longer than the excitation light, that is, the light having a peak in the wavelength of 580 nm to 700 nm.

Desirably, the element M' is Sr (Strontium). The element M' may include other elements such as Ca (Calcium) less than or equal to around 10 mol % in addition to Sr.

The silicate phosphor of the first embodiment has a composition expressed by the following equation (3). In the silicate phosphor, the luminous efficiency is high at relatively low temperature, while the decrease in luminous efficiency is large at high temperature. That is, the silicate phosphor has a characteristic of the large thermal quenching.

(3)

(In the equation (3), x3, y2, z2, a2, b2, and c2 satisfy the following relationship.

$0<x3≤1$, $0≤y2≤1$, $0≤z2≤1$, $1.5<a2<2.5$, $0.5<b2<1.5$, $3.5<c2<4.5$)

Figure 3:
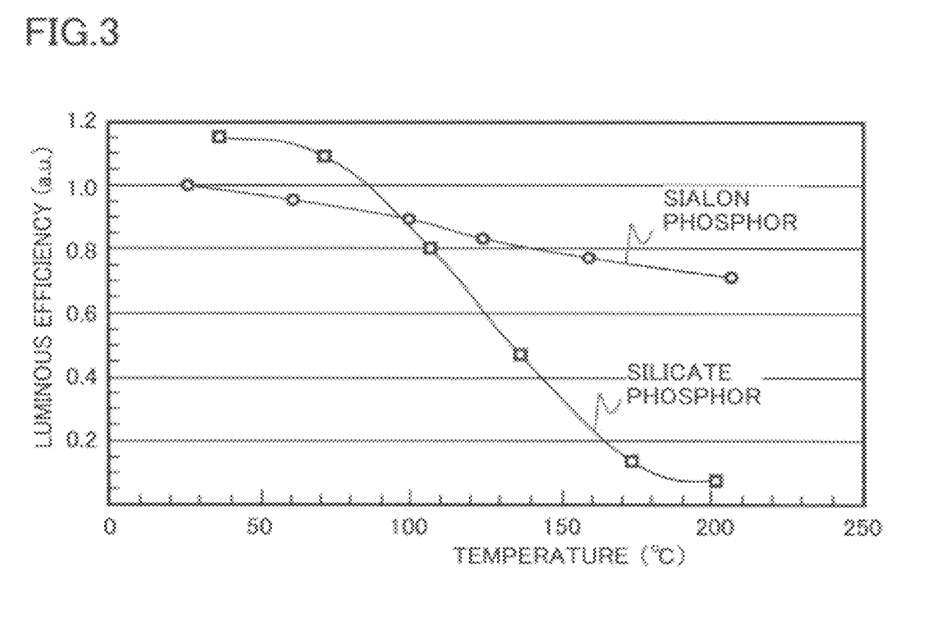
FIG. 3 is a comparison chart illustrating luminous efficiency of phosphors.

FIG. 3 is a comparison chart illustrating luminous efficiency of phosphors. A horizontal axis indicates a temperature of the phosphor, and a vertical axis indicates luminous efficiency that is normalized by the luminous efficiency of the sialon phosphor at room temperature (25° C.) The characteristics of the sialon phosphor and silicate phosphor are plotted within the composition range.

In the sialon phosphor, the decrease in luminous efficiency is relatively small at a high temperature. In the silicate phosphor, the luminous efficiency is high at relatively low temperature, while the decrease in luminous efficiency is large at high temperature. The silicate phosphor is higher than the sialon phosphor in the luminous efficiency at 50° C., and the silicate phosphor is lower than the first phosphor 1 in the luminous efficiency at 150° C.

Figure 4:
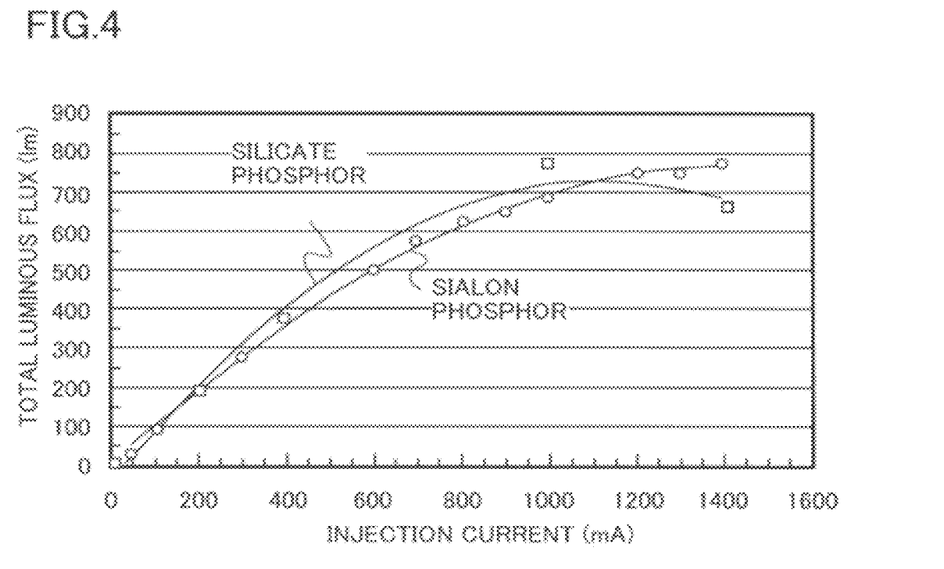
FIG. 4 is a view illustrating the luminous efficiency of the light emitting devices.

FIG. 4 is a view illustrating luminous efficiency of the light emitting device. FIG. 4 illustrates a relationship between an injection current and a total luminous flux with respect to a light emitting module of the white-color LED in which the sialon phosphor is used within the composition range and a light emitting module of the white-color LED in which the silicate phosphor is used within the composition range. In the light emitting module, 16 white-color LEDs are disposed in a 4-by-4 array.

For the light emitting module of the white-color LED in which the sialon phosphor is used, the luminous efficiency at the low injection current is lower than that of the light emitting module of the white-color LED in which the silicate phosphor is used. However, the luminous efficiency is not degraded at the high injection current for the sialon phosphor, while the luminous efficiency is degraded at the high injection current for the silicate phosphor. This is because the decrease in luminous efficiency is small on the high temperature side of the sialon phosphor.

In FIG. 4, the luminous efficiency of the sialon phosphor is larger than that of the silicate phosphor near the injection current of 1100 mA (13 W in terms of power). At this point, the white-color LED or the board has a temperature of about 100° C.

Figure 9:
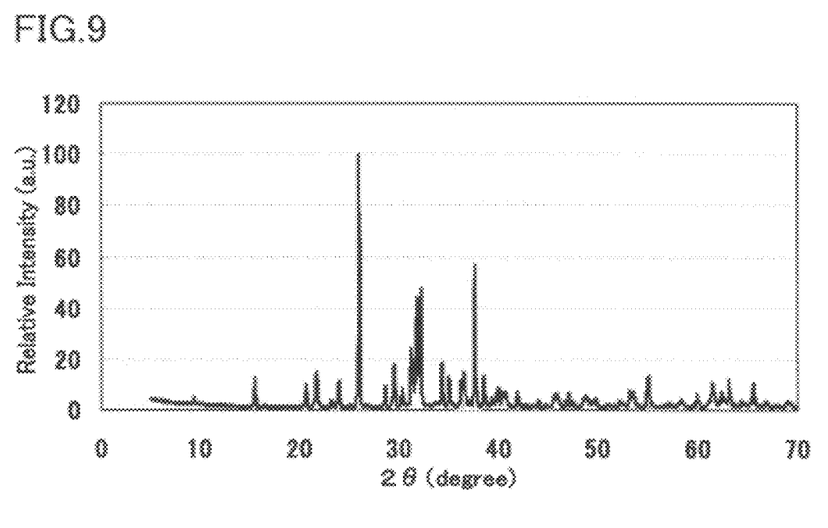
FIG. 9 is a XRD profile of the green phosphor G1.
Figure 10:
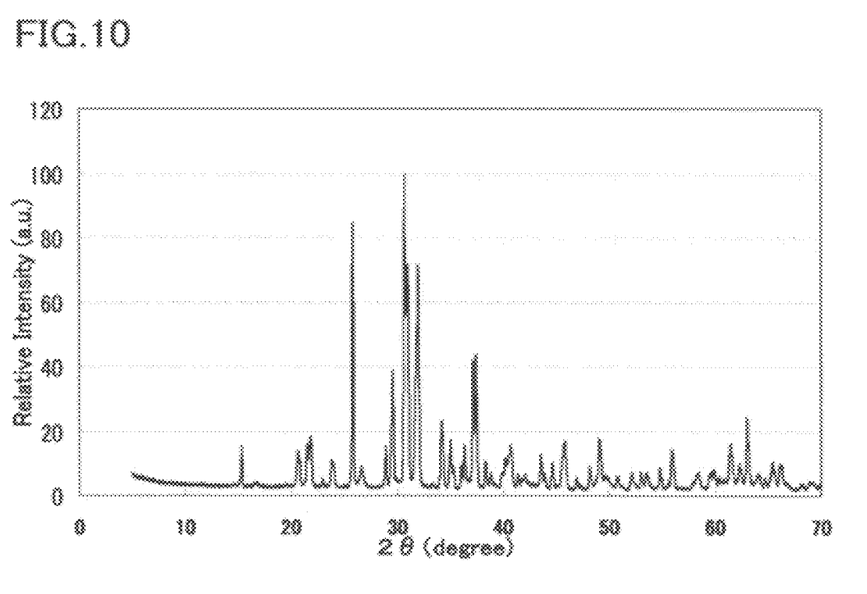
FIG. 10 is a XRD profile of the green phosphor G2.

The green phosphors expressed by the above-described equation (1) of the embodiment have orthorhombic crystal structure. As shown in FIGS. 9, 10, the green phosphors include a component which shows diffraction peaks in at least 6 diffraction degree (2θ (two theta)) ranges simultaneously among 15 ranges listed below under X-ray diffraction analysis using CuKα characteristic X-ray (wave length of 1.54056 angstroms). The 15 diffraction degree (2θ (two theta)) ranges are, 30.5-30.9°, 25.6-30.0°, 31.8-32.2°, 37.2-37.6°, 37.0-37.4°, 29.3-29.7°, 34.0-34.4°, 21.7-22.1°, 48.9-49.3°, 45.7-46.1°, 62.8-63.2°, 15.2-15.6°, 61.3-61.7°, 40.5-40.9°, 55.8°-56.2°. The compositions of the green phosphors used for the evaluation of FIGS. 9, 10 are shown in Table 1.

TABLE 1

|  | x1 | y1 | z1 | u | w | Peak Wave Length (nm) |
|---|---|---|---|---|---|---|
| G1 | 0.100 | −0.082 | 0.030 | −0.061 | 0.091 | 520 |
| G2 | 0.018 | −0.085 | −0.962 | −0.553 | 0.618 | 519 |

Figure 11:
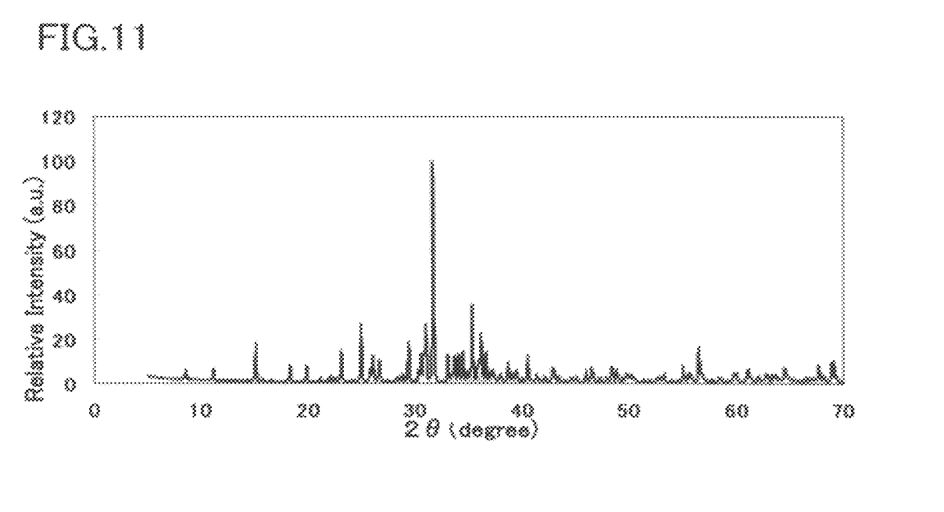
FIG. 11 is a XRD profile of the red phosphor R1.
Figure 12:
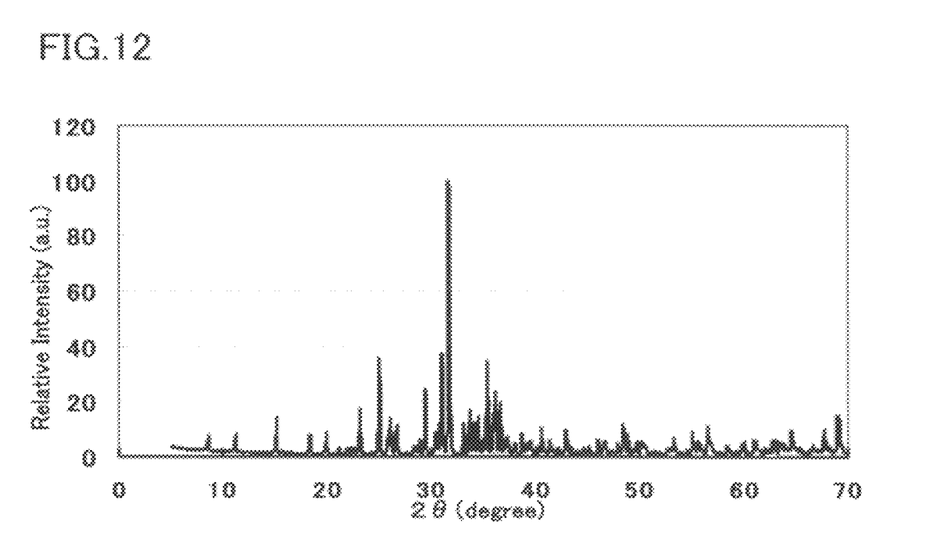
FIG. 12 is a XRD profile of the red phosphor R2.

And the red phosphors expressed by the above-described equation (2) of the embodiment have orthorhombic crystal structure. As shown in FIGS. 11, 12, the red phosphors include a component which shows diffraction peaks in at least 9 diffraction degree (2θ (two theta)) ranges simultaneously among 11 ranges listed below under X-ray diffraction analysis using CuKα characteristic X-ray (wave length of 1.54056 angstroms). The 11 diffraction degree (2θ (two theta)) ranges are, 31.6-31.8°, 30.9-31.1°, 24.85-25.05°, 35.25-35.45°, 15.0-15.25°, 56.4-56.65°, 36.1-36.25°, 33.0-33.20°, 23.1-23.20°, 29.3-29.6°, 26.95-26.15°. The compositions of the red phosphors used for the evaluation of FIGS. 11, 12 are shown in Table 2.

TABLE 2

|  | X2 | a1 | b1 | c1 | d1 | Peak Wave Length (nm) |
|---|---|---|---|---|---|---|
| R1 | 0.05 | 0.62 | 2.36 | 0.16 | 4.48 | 641 |
| R2 | 0.037 | 0.68 | 2.64 | 0.16 | 4.86 | 634 |

In the first embodiment, the white-color LED in which the sialon phosphor whose decrease in luminous efficiency is relatively small at high temperature is used and the white-color LED in which the silicate phosphor in which luminous efficiency in relatively large at low temperature while the decrease in luminous efficiency is large at high temperature is used are disposed in the same board. Accordingly, the luminous efficiency can be maintained by contribution of the silicate phosphor in the low temperature range of the low injection current, and the luminous efficiency can be maintained by contribution of the sialon phosphor in the high temperature range of the high injection current. Therefore, the light emitting device that realizes the excellent luminous efficiency from low temperature to high temperature, that is, in the range of the low current to the high current can be provided. Particularly, the light emitting device is easy to produce, because only the two kinds of the white-color LEDs are disposed in the same board.

Desirably the temperature of the second fluorescent layer in which the silicate phosphor is used is lower than 100° C. from the viewpoint of maintaining the luminous efficiency. In other words, the second fluorescent layer desirably becomes a temperature of 100° C. or less in a usage state. Because the fluorescent layer, the light emitting element, and the board on which the light emitting element is mounted are extremely close to one another, the temperature of the fluorescent layer can be evaluated by measuring the temperature of the light emitting element or the temperature immediately below the board on which the light emitting element is mounted.

In the first embodiment, for example, in order to adjust color development of the light emitting device or the white-color LED, a phosphor having another composition may be used in the first or second fluorescent layer in addition to the sialon phosphor or silicate phosphor. The fluorescent layer may be formed by mixing the plural phosphors or formed by stacking the fluorescent layers including the different phosphors.

The disposition pattern of the first white-color LED 14 and the second white-color LED 16 is not limited to that of FIG. 1. Alternatively, for example, a diced pattern may be used as the disposition pattern. The numbers of the disposed first LEDs 14 and second LEDs 16 may optimally be selected in consideration of the luminous efficiency.

(Second Embodiment)

A light emitting device according to a second embodiment differs from the light emitting device of the first embodiment only in that the first light emitting element is mounted on a first region of the board, the second light emitting element is mounted on a second region of the board, and a rate of increase in temperature of the first region is higher than that of the second region, i.e., the first region has higher rate of increase in temperature than that of the second region. Therefore, the description of the contents overlapped with those of the first embodiment is omitted.

Figure 5:
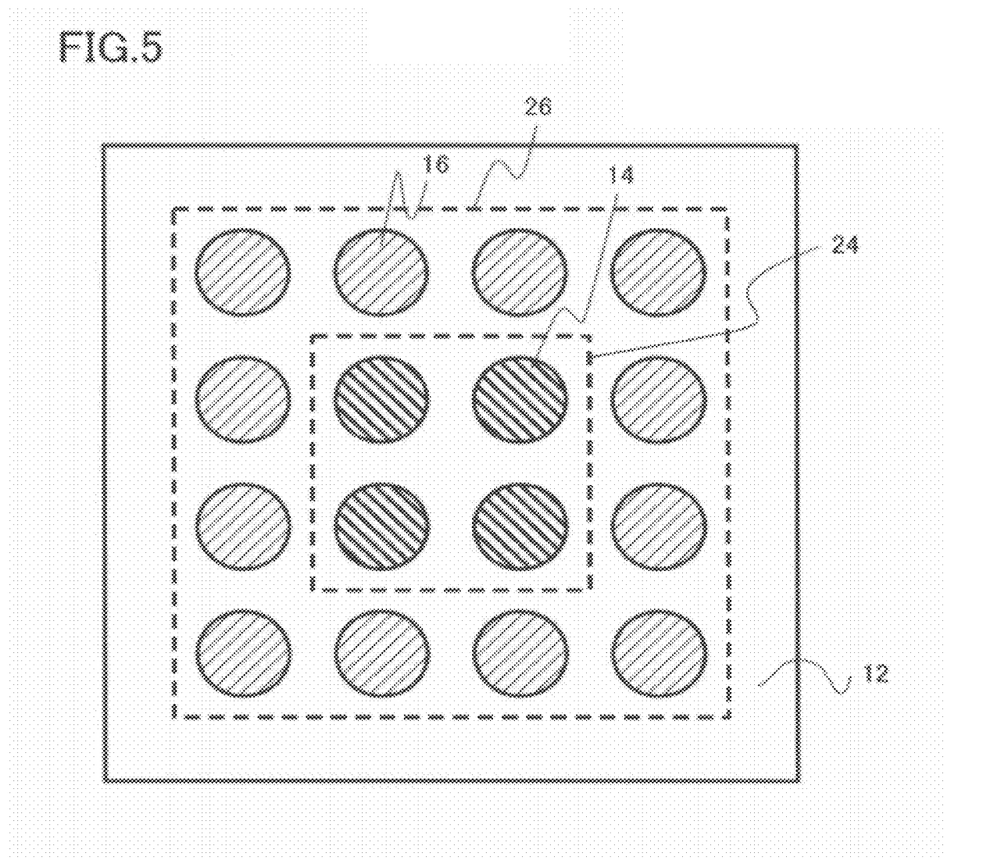
FIG. 5 is a schematic plan view illustrating a light emitting device according to a second embodiment.

FIG. 5 is a schematic perspective view illustrating the light emitting device of the second embodiment. As illustrated in FIG. 5, the first white-color LED 14 is disposed in a first region 24 on the board 12, and the second white-color LED 16 is disposed in a second region 26 on the board 12. That is, the first light emitting element 14a is mounted on the first region 24 of the board 12, and the second light emitting element 16a is mounted on the second region 26 of the board 12. The first region 24 is surrounded by the second region 26.

Because the first region 24 is located inside the second region 26, heat generated by the light emitting element is easily accumulated. Accordingly, the rate of increase in temperature of the first region becomes higher than that of the second region in an arbitrary injection current amount (input power).

Accordingly, according to the second embodiment, the white-color LED in which the phosphor whose the decrease in luminous efficiency is small at high temperature is used is disposed in the region having the high rate of increase in temperature, and the white-color LED in which the phosphor, in which luminous efficiency is relatively large at low temperature while the decrease in luminous efficiency is large at high temperature, is used is disposed in the region having the low rate of increase in temperature. Accordingly, in the light emitting device in which the two kinds of the white-color LEDs are used, the luminous efficiency can further be improved at low and high temperatures while maintaining high package density.

(Third Embodiment)

A light emitting device according to a third embodiment differs from the light emitting device of the second embodiment only in that the packaging density of the first light emitting element in the first region is higher than that of the second light emitting element in the second region. Therefore, the description of the contents overlapped with those of the first embodiment is omitted.

Figure 6:
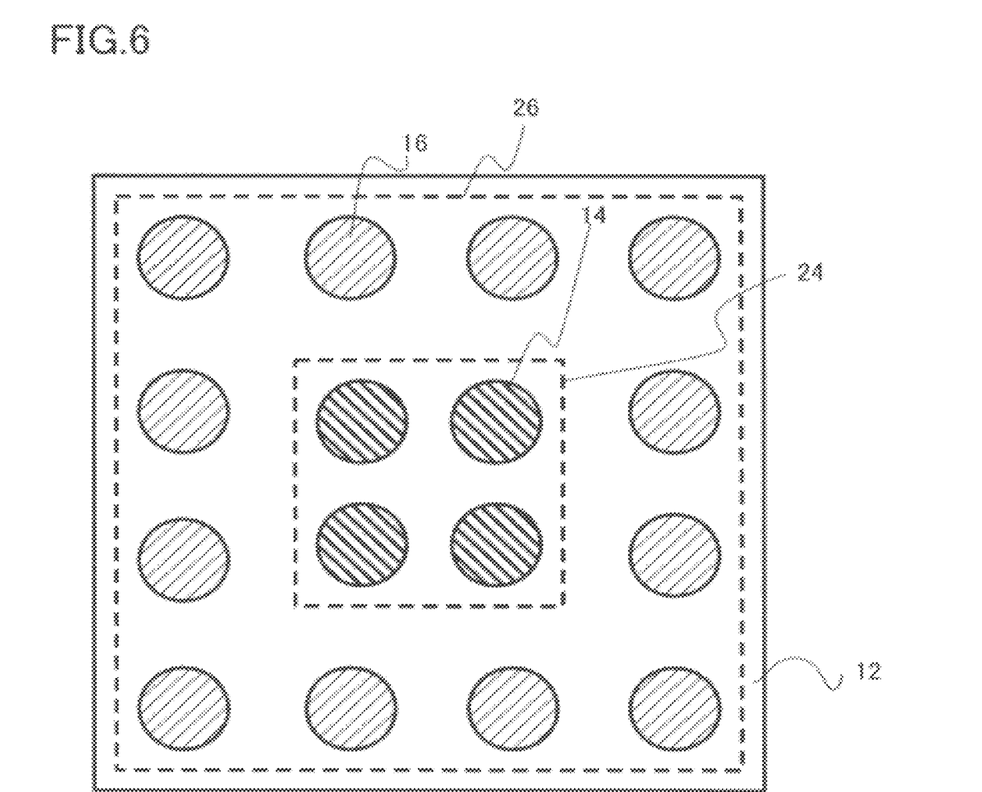
FIG. 6 is a schematic plan view illustrating a light emitting device according to a third embodiment.

FIG. 6 is a schematic plan view illustrating the light emitting device of the third embodiment. As illustrated in FIG. 6, the first white-color LED 14 is disposed in a first region 24 on the board 12, and the second white-color LED 16 is disposed in a second region 26 on the board 12. That is, the first light emitting element 14a is mounted on the first region 24 of the board 12, and the second light emitting element 16a is mounted on the second region 26 of the board 12. The packaging density of the first light emitting element 14a in the first region 24 is higher than that of the second light emitting element 16a in the second region 26.

Because the first region 24 is higher than the second region 26 in the packaging density of the light emitting element, the heat generated by the light emitting element is easily accumulated. Accordingly, the rate of increase in temperature of the first region becomes higher than that of the second region in an arbitrary injection current amount (input power).

Accordingly, according to the third embodiment, the white-color LED in which the phosphor whose the decrease in luminous efficiency is small at high temperature is used is disposed in the region having the high rate of increase in temperature, and the white-color LED in which the phosphor, in which luminous efficiency is relatively large at low temperature while the decrease in luminous efficiency is large at high temperature, is used is disposed in the region having the low rate of increase in temperature. Accordingly, in the light emitting device in which the two kinds of the white-color LEDs are used, the luminous efficiency can further be improved at low and high temperatures.

(Fourth Embodiment)

A light emitting device according to a fourth embodiment differs from the light emitting device of the first embodiment only in that a thermal resistance of the board in the first region is higher than that of the board in the second region. Therefore, the description of the contents overlapped with those of the first embodiment is omitted.

Figure 7:
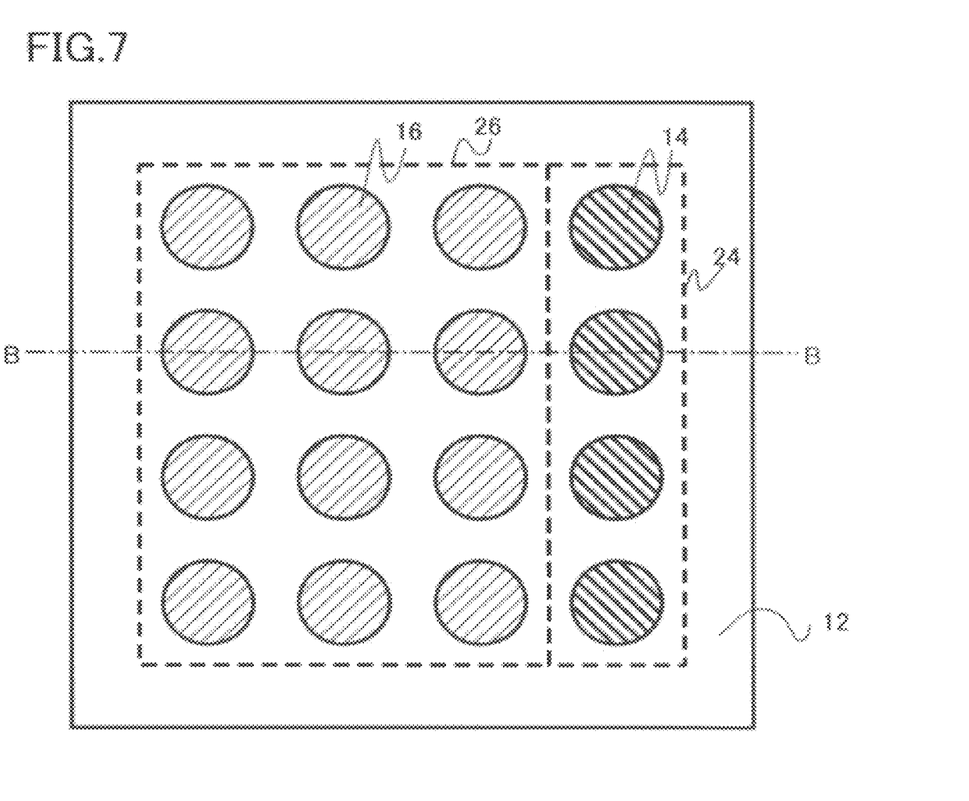
FIG. 7 is a schematic plan view illustrating a light emitting device according to a fourth embodiment.
Figure 8:
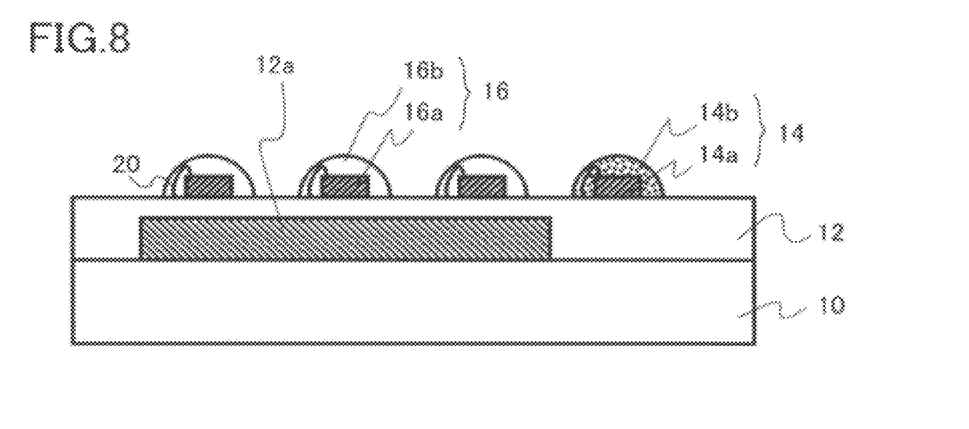
FIG. 8 is a schematic sectional view taken on a line B-B of FIG. 7.

FIG. 7 is a schematic plan view illustrating the light emitting device of the fourth embodiment. FIG. 8 is a schematic sectional view taken on a line B-B of FIG. 7.

In the light emitting device of the fourth embodiment, a region located below the second region 26 of the board 12 is made of a material 12a whose thermal conductivity is larger than that of other regions of the board 12. Therefore, the thermal resistance of the board in the first region 24, that is, a thermal resistance $Rth_1$ between the white-color LED 14 and the heat sink 10 is larger than the thermal resistance of the board in the second region 26, that is, a thermal resistance $Rth_2$ between the white-color LED 16 and the heat sink 10.

According to the fourth embodiment, because of the above-described configuration, the rate of increase in temperature in the first region is higher than the rate of increase in temperature in the second region.

Accordingly, according to the fourth embodiment, the white-color LED in which the phosphor whose the decrease in luminous efficiency is small at high temperature is used is disposed in the region having the high rate of increase in temperature, and the white-color LED in which the phosphor, in which luminous efficiency is relatively large at low temperature while the decrease in luminous efficiency is large at high temperature, is used is disposed in the region having the low rate of increase in temperature. Accordingly, in the light emitting device in which the two kinds of the white-color LEDs are used, the luminous efficiency can further be improved at low and high temperatures.

In the fourth embodiment, by way of example, the different kinds of the boards are used in order that the thermal resistance $Rth_1$ of the board in the first region is higher than the thermal resistance $Rth_2$ of the board in the second region. Alternatively, for example, the thermal resistance $Rth_1$ may be larger than the thermal resistance $Rth_2$ without changing the material by shortening a distance between the board 12 and the heat sink 10 in the second region.

When the sialon phosphor is used as the first phosphor while the silicate phosphor is used as the second phosphor, desirably the thermal resistance $Rth_1$ of the first region satisfies $Rth_1 > 8$ (° C./W) and the thermal resistance $Rth_2$ of the second region satisfies $Rth_1 \leq 8$ (° C./W).

As illustrated in FIG. 4, the luminous efficiency of the sialon phosphor is larger than that of the silicate phosphor near the injection current of 1100 mA (13 W in terms of power). Accordingly, in the light emitting device having the maximum usage power of 13 W, when the thermal resistance $Rth_2$ of the second region satisfies $Rth_1 \leq 8$ (° C./W), the second region can be prevented from becoming the temperature of 100° C. or more, and the high luminous efficiency can be realized.

While certain embodiments have been described, these embodiments have been presented by way of example only, and are not intended to limit the scope of the inventions. Indeed, the light emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, a semiconductor light emitting device that emits the light in the ultraviolet region or the blue light may be used as the light emitting element that emits the excitation light used in the light emitting device. A gallium nitride compound semiconductor can be used as the LED.

When the blue LED is used as the light emitting element, the phosphor is not limited to the combination of the red phosphor and the green phosphor, but the yellow phosphor, the combination of the yellow phosphor and the red phosphor, the combination of the red phosphor, the yellow phosphor, and the green phosphor, the combination of the orange phosphor and the green phosphor, the combination of the red phosphor and the blue-green phosphor, and the combination of the orange phosphor and the blue-green phosphor may be used as the phosphor. When the near-ultraviolet LED is used as the phosphor, the combination of the red phosphor, the green phosphor, and the blue phosphor and the combination of the red phosphor, the yellow phosphor, the green phosphor, and the blue phosphor may be used as the light emitting element.

When at least two kinds of the phosphors are used, the phosphors may be used by being mixed on a single-layer phosphor layer, but preferably a multi-layer structure application in which the phosphor emitting the longer-wavelength light is applied inside while the phosphor emitting the shorter-wavelength light is applied outside is adopted in order to prevent re-absorption between the phosphors. More preferably a multi-layer structure application in which the transparent resin layer is sandwiched between the phosphor emitting the longer-wavelength light and the phosphor emitting the shorter-wavelength light is adopted.

In the embodiments, the sialon phosphor is used as the first phosphor by way of example. From the viewpoint of suppressing the thermal quenching, particularly the phosphor expressed by the equations (1) and (2) is desirably used. Alternatively, another phosphor may be used. In the embodiments, the silicate phosphor is used as the second phosphor by way of example. From the viewpoint of realizing the high luminous efficiency at low temperature, particularly the phosphor expressed by the equation (3) is desirably used. Alternatively, another phosphor may be used.

In the embodiments, the two kinds of the white-color LEDs are described by way of example. However, the invention is not limited to the white-color LED. For example, at least three kinds of the white-color LEDs may be used.

What is claimed is:

1. A light emitting device comprising:
    a board;
    a plurality of first light emitting elements mounted on the board to emit light having a wavelength of 250 nm to 500 nm;
    a plurality of second light emitting elements mounted on the board to emit light having a wavelength of 250 nm to 500 nm;
    a first fluorescent layer formed on each of the first light emitting elements, the first fluorescent layer including a first phosphor; and
    a second fluorescent layer formed on each of the second light emitting elements, the second fluorescent layer including a second phosphor being higher than the first phosphor in luminous efficiency at 50° C., being lower than the first phosphor in the luminous efficiency at 150° C.,
    wherein the first light emitting elements are mounted on a first region of the board,
    the second light emitting elements are mounted on a second region of the board, and
    the first region has higher rate of increase in temperature than that of the second region.

2. A light emitting device comprising:
    a board;
    a plurality of first light emitting elements mounted on the board to emit light having a wavelength of 250 nm to 500 nm;
    a plurality of second light emitting elements mounted on the board to emit light having a wavelength of 250 nm to 500 nm;
    a first fluorescent layer formed on each of the first light emitting elements, the first fluorescent layer including a first phosphor; and
    a second fluorescent layer formed on each of the second light emitting elements, the second fluorescent layer including a second phosphor being higher than the first phosphor in luminous efficiency at 50° C., being lower than the first phosphor in the luminous efficiency at 150° C.,
    wherein packaging density of the first light emitting elements in a first region of the board is higher than that of the second light emitting elements in a second region.

3. A light emitting device comprising:
    a board;
    a plurality of first light emitting elements mounted on the board to emit light having a wavelength of 250 nm to 500 nm;
    a plurality of second light emitting elements mounted on the board to emit light having a wavelength of 250 nm to 500 nm;
    a first fluorescent layer formed on each of the first light emitting elements, the first fluorescent layer including a first phosphor; and
    a second fluorescent layer formed on each of the second light emitting elements, the second fluorescent layer including a second phosphor being higher than the first phosphor in luminous efficiency at 50° C., being lower than the first phosphor in the luminous efficiency at 150° C.,
    wherein the first light emitting elements are mounted on a first region of the board,
    the second light emitting elements are mounted on a second region of the board, and
    wherein the first region is surrounded by the second region.

4. A light emitting device comprising:
    a board;
    a plurality of first light emitting elements mounted on the board to emit light having a wavelength of 250 nm to 500 nm;
    a plurality of second light emitting elements mounted on the board to emit light having a wavelength of 250 nm to 500 nm;
    a first fluorescent layer formed on each of the first light emitting elements, the first fluorescent layer including a first phosphor; and
    a second fluorescent layer formed on each of the second light emitting elements, the second fluorescent layer including a second phosphor being higher than the first phosphor in luminous efficiency at 50° C., being lower than the first phosphor in the luminous efficiency at 150° C.,
    wherein the first light emitting elements are mounted on a first region of the board,
    the second light emitting elements are mounted on a second region of the board, and
    wherein a thermal resistance of the board in the first region is larger than that of the board in the second region.

5. The device according to claim 1, wherein white-color light is emitted by the first light emitting element and the first fluorescent layer, and white-color light is emitted by the second light emitting element and the second fluorescent layer.

6. The device according to claim 1, wherein the first light emitting element or the second light emitting element is a semiconductor light emitting element that emits ultraviolet light or blue light.

7. The device according to claim 1, wherein the first phosphor has a composition expressed by equation (1) or equation (2), and the second phosphor has a composition expressed by equation (3):

$$(M_{1-x1}Eu_{x1})_{3-y1}Si_{13-z1}Al_{3+z1}O_{2+u}N_{21-w} \quad (1)$$

(In the equation (1), M is an element that is selected from IA group elements, IIA group elements, IIIA group elements, IIIB group elements except Al, rare-earth elements, and IVB group elements, and x1, y1, z1, u, and w satisfy the following relationship:

$0<x1<1$, $-0.1<y1<0.3$, $-3<z1\leq 1$, $-3<u-w\leq 1.5$)

$$(M'_{1-x2}Eu_{x2})_{a1}Si_{b1}AlO_{c1}N_{d1} \quad (2)$$

(In the equation (2), M' is an element that is selected from IA group elements, IIA group elements, IIIA group elements, IIIB group elements except Al(Aluminum), rare-earth elements, and IVB group elements, and x2, a1, b1, c1, and d1 satisfy the following relationship:

$0<x2<1$, $0.55<a1<0.95$, $2.0<b1<3.9$, $0<c1<0.6$, $4<d1<5.7$)

$$(Ba_{1-y2-z2-x3}Ca_{y2}Sr_{z2}Eu_{x3})_{a2}Si_{b2}O_{c2} \quad (3)$$

(In the equation (3), x3, y2, z2, a2, b2, and c2 satisfy the following relationship:

$0<x3\leq 1$, $0\leq y2\leq 1$, $0\leq z2\leq 1$, $1.5\leq a2<2.5$, $0.5<b2<1.5$, $3.5<c2<4.5$).

8. The device according to claim 7, wherein the second fluorescent layer becomes a temperature of 100° C. or less in a usage state.

9. The device according to claim 7, wherein white-color light is emitted by the first light emitting element and the first fluorescent layer, and white-color light is emitted by the second light emitting element and the second fluorescent layer.

10. The device according to claim 7, wherein the first light emitting element or the second light emitting element is a semiconductor light emitting element that emits ultraviolet light or blue light.

11. The device according to claim 4, wherein the first phosphor has a composition expressed by equation (1) or equation (2), and the second phosphor has a composition expressed by equation (3):

$$(M_{1-x1}Eu_{x1})_{3-y1}Si_{13-z1}Al_{3+z1}O_{2+u}N_{21-w} \quad (1)$$

(In the equation (1), M is an element that is selected from IA group elements, IIA group elements, IIIA group elements, IIIB group elements except Al(Aluminum), rare-earth elements, and IVB group elements, and x1, y1, z1, u, and w satisfy the following relationship:

$0<x1<1$, $-0.1<y1<0.3$, $-3<z1\leq 1$, $-3<u-w\leq 1.5$)

$$(M'_{1-x2}Eu_{x2})_{a1}Si_{b1}AlO_{c1}N_{d1} \quad (2)$$

(In the equation (2), M' is an element that is selected from IA group elements, IIA group elements, IIIA group elements, IIIB group elements except Al(Aluminum), rare-earth elements, and IVB group elements, and x2, a1, b1, c1, and d1 satisfy the following relationship:

$0<x2<1$, $-0.55<a1<0.95$, $2.0<b1<3.9$, $0<c1<0.6$, $4<d1<5.7$)

$$(Ba_{1-y2-z2-x3}Ca_{y2}Sr_{z2}Eu_{x3})_{a2}Si_{b2}O_{c2} \quad (3)$$

(In the equation (3), x3, y2, z2, a2, b2, and c2 satisfy the following relationship:

$0<x3\leq 1$, $0\leq y2\leq 1$, $0\leq z2\leq 1$, $1.5<a2<2.5$, $0.5<b2<1.5$, $3.5<c2<4.5$).

12. The device according to claim 11, wherein the second fluorescent layer becomes a temperature of 100° C. or less in a usage state.

13. The device according to claim 11, wherein white-color light is emitted by the first light emitting element and the first fluorescent layer, and white-color light is emitted by the second light emitting element and the second fluorescent layer.

14. The device according to claim 2, wherein the first phosphor has a composition expressed by equation (1) or equation (2), and the second phosphor has a composition expressed by equation (3):

$$(M_{1-x1}Eu_{x1})_{3-y1}Si_{13-z1}Al_{3+z1}O_{2+u}N_{21-w} \quad (1)$$

(In the equation (1), M is an element that is selected from IA group elements, IIA group elements, IIIA group elements, IIIB group elements except Al, rare-earth elements, and IVB group elements, and x1, y1, z1, u, and w satisfy the following relationship:

$0 < x1 < 1$, $-0.1 < y1 < 0.3$, $-3 < z1 \leq 1$, $-3 < u-w \leq 1.5$)

$$(M'_{1-x2}Eu_{x2})_{a1}Si_{b1}AlO_{c1}N_{d1} \qquad (2)$$

(In the equation (2), M' is an element that is selected from IA group elements, IIA group elements, IIIA group elements, IIIB group elements except Al(Aluminum), rare-earth elements, and IVB group elements, and x2, a1, b1, c1, and d1 satisfy the following relationship:

$0 < x2 < 1$, $0.55 < a1 < 0.95$, $2.0 < b1 < 3.9$, $0 < c1 < 0.6$, $4 < d1 < 5.7$)

$$(Ba_{1-y2-z2-x3}Ca_{y2}Sr_{z2}Eu_{x3})_{a2}Si_{b2}O_{c2} \qquad (3)$$

(In the equation (3), x3, y2, z2, a2, b2, and c2 satisfy the following relationship:

$0 < x3 \leq 1$, $0 \leq y2 \leq 1$, $0 \leq z2 \leq 1$, $1.5 < a2 < 2.5$, $0.5 < b2 < 1.5$, $3.5 < c2 < 4.5$).

15. The device according to claim 14, wherein the second fluorescent layer becomes a temperature of 100° C. or less in a usage state.

16. The device according to claim 14, wherein white-color light is emitted by the first light emitting element and the first fluorescent layer, and white-color light is emitted by the second light emitting element and the second fluorescent layer.

17. The device according to claim 3, wherein the first phosphor has a composition expressed by equation (1) or equation (2), and the second phosphor has a composition expressed by equation (3):

$$(M_{1-x1}Eu_{x1})_{3-y1}Si_{13-z1}Al_{3+z1}O_{2+u}N_{21-w} \qquad (1)$$

In the equation (1), M is an element that is selected from IA group elements, IIA group elements, IIIA group elements, IIIB group elements except Al(Aluminum), rare-earth elements, and IVB group elements, and x1, y1, z1, u, and w satisfy the following relationship:

$0 < x1 < 1$, $-0.1 < y1 < 0.3$, $-3 < z1 \leq 1$, $-3 < u-w \leq 1.5$)

$$(M'_{1-x2}Eu_{x2})_{a1}Si_{b1}AlO_{c1}N_{d1} \qquad (2)$$

(In the equation (2), M' is an element that is selected from IA group elements, IIA group elements, IIIA group elements, IIIB group elements except Al(Aluminum), rare-earth elements, and IVB group elements, and x2, a1, b1, c1, and d1 satisfy the following relationship:

$0 < x2 < 1$, $0.55 < a1 < 0.95$, $2.0 < b1 < 3.9$, b $0 < c1 < 0.6$, $4 < d1 < 5.7$)

$$(Ba_{1-y2-z2-x3}Ca_{y2}Sr_{z2}Eu_{x3})_{a2}Si_{b2}O_{c2} \qquad (3)$$

(In the equation (3), x3, y2, z2, a2, b2, and c2 satisfy the following relationship:

$0 < x3 \leq 1$, $0 \leq y2 \leq 1$, $0 \leq z2 \leq 1$, $1.5 < a2 < 2.5$, $0.5 < b2 < 1.5$, $3.5 < c2 < 4.5$).

18. The device according to claim 17, wherein the second fluorescent layer becomes a temperature of 100° C. or less in a usage state.

19. The device according to claim 17, wherein white-color light is emitted by the first light emitting element and the first fluorescent layer, and white-color light is emitted by the second light emitting element and the second fluorescent layer.

* * * * *